United States Patent [19]
Tomita et al.

[11] Patent Number: 5,870,038
[45] Date of Patent: Feb. 9, 1999

[54] CIRCUIT FOR CONVERTING SAMPLING PHASE OF DIGITAL DATA

[75] Inventors: Yoshinori Tomita, Kanagawa; Toshitaka Senuma, Tokyo, both of Japan

[73] Assignee: Sony Corporation, Tokyo, Japan

[21] Appl. No.: 513,130

[22] Filed: Aug. 9, 1995

[30] Foreign Application Priority Data

Aug. 12, 1994 [JP] Japan ................................ 6-212107

[51] Int. Cl.$^6$ ................................................ H03M 7/00
[52] U.S. Cl. ........................................... 341/61; 364/724.1
[58] Field of Search ........................ 341/61, 122, 123; 364/724.1

[56] References Cited

U.S. PATENT DOCUMENTS

| | | | |
|---|---|---|---|
| 4,954,824 | 9/1990 | Yamada et al. | 341/61 |
| 5,301,196 | 4/1994 | Ewen et al. | 370/105.2 |
| 5,774,080 | 6/1998 | Morley | 341/101 |

FOREIGN PATENT DOCUMENTS

0 292 108 A   11/1988   European Pat. Off. .

*Primary Examiner*—Howard L. Williams
*Assistant Examiner*—Peguy Jean Pierre
*Attorney, Agent, or Firm*—Frommer Lawrence & Haug, LLP; William S. Frommer

[57] ABSTRACT

A sampling phase of digital data is converted with having a phase stabilization and a phase alignment. In a converting circuit for converting first digital data synchronized with a fist clock into second digital data synchronized with a second clock not synchronized with the first clock, there are provided; a dividing circuit for dividing 1 (one) time period of the first clock into N time periods ("N" being larger than, or equal to 2); a coefficient setting circuit for setting first and second interpolation coefficients with respect to each of the divided time periods; a data producing circuit for producing the second digital data from data within a certain clock period and data within another clock period subsequent to the certain clock period among the first digital data by using the first and second interpolation coefficients in the divided period where the second clock is located, among the first and second interpolation coefficients set for each of the divided periods.

20 Claims, 7 Drawing Sheets

| TIME PERIOD | $K_A$ | $K_B$ |
|---|---|---|
| $T_1$ | 1 | 0 |
| $T_2$ | 3/4 | 1/4 |
| $T_3$ | 2/4 | 2/4 |
| $T_4$ | 1/4 | 3/4 |
| $T_5$ | 0 | 1 |
| $T_6$ | 1/4 | 3/4 |
| $T_7$ | 2/4 | 2/4 |
| $T_8$ | 3/4 | 1/4 |

CIRCUIT FOR CONVERTING SAMPLING PHASE OF DIGITAL DATA

BACKGROUND OF THE INVENTION

1. Field of the Invention

The present invention relates to a converting circuit for a sampling phase of digital data.

2. Description of the Related Art

Figure 6:
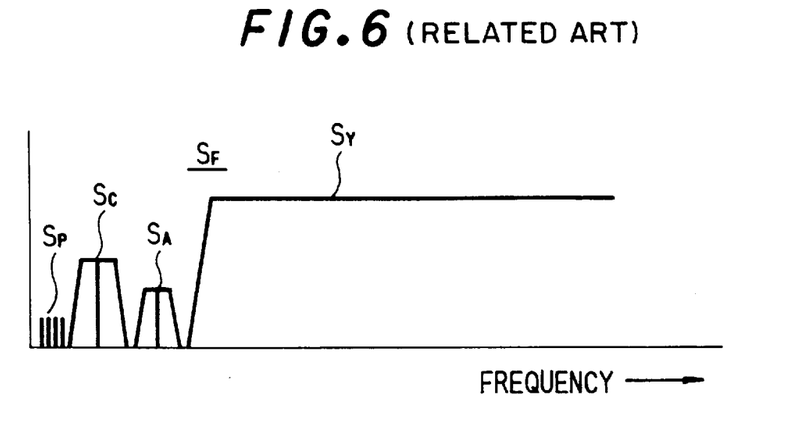
FIG. 6 graphically represents an example of a frequency spectrum.

In home-use VTRs, for instance, an 8-mm video recorder, a luminance signal is converted into an FM signal SY during a recording operation (see FIG. 6). Further, a carrier color signal SC is frequency-converted into a lower band side of the FM luminance signal, and an audio signal is converted into an FM signal SA in a band between the signal SC and the signal SY. Then, a frequency multiplexed signal SF produced from these signals SY, SC, SA and a tracking servo pilot signal SP is recorded on a magnetic tape by way of a rotary magnetic head in such a manner that a 1-field signal SF becomes one inclined magnetic track on this magnetic tape.

Figure 7:
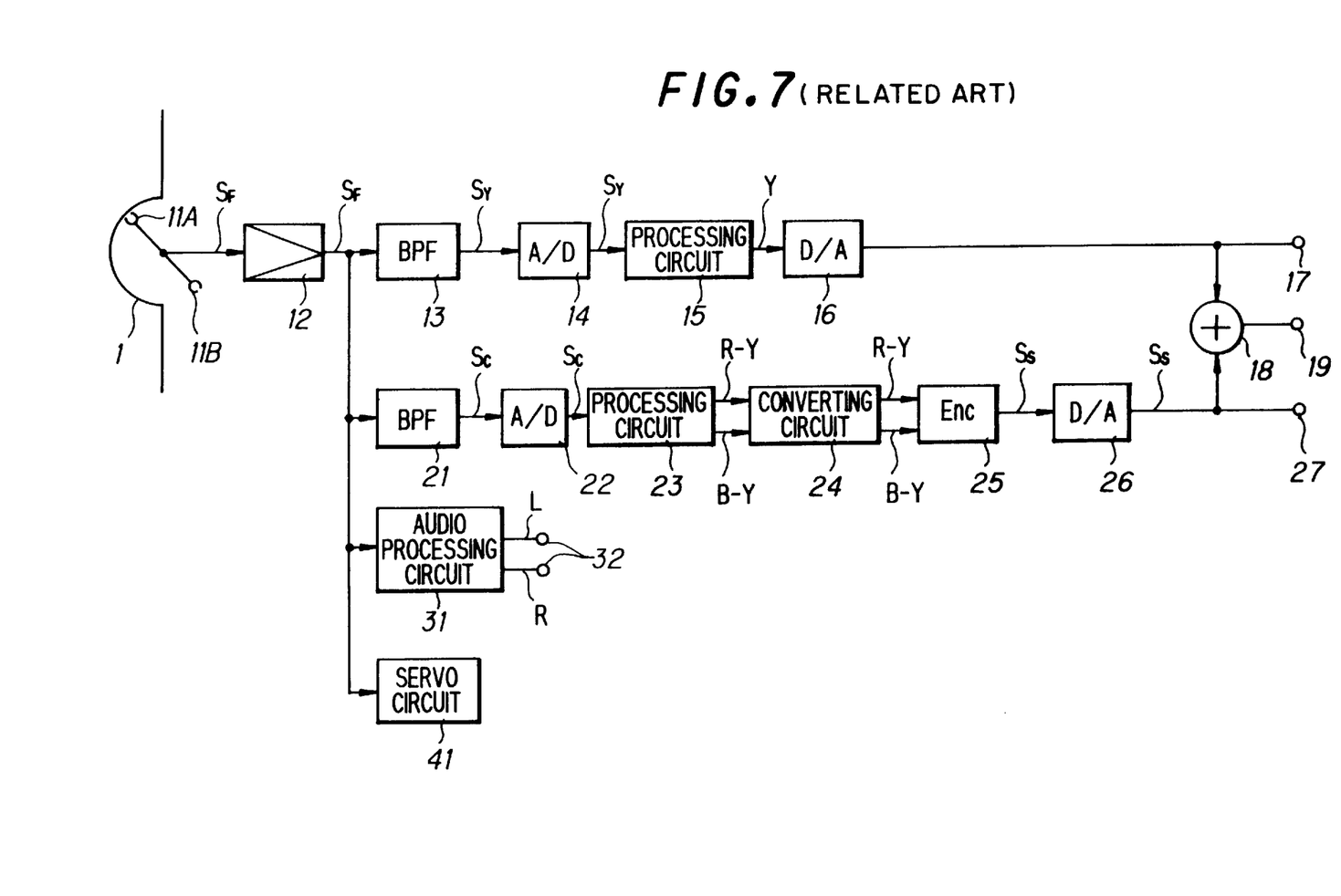
FIG. 7 is a schematic circuit diagram for showing an example of the VTR signal reproducing system.

As a consequence, this signal reproducing system may be arranged as shown in, for example, FIG. 7. That is, the frequency multiplexed signal SF is continuously reproduced from the magnetic tape 1 by the rotary magnetic heads 11A and 11B. The reproduced signal SF is supplied via the reproducing amplifier 12 to the servo circuit 41, so that the tracking servo control for the heads 11A and 11B with respect to the tracks of the magnetic tape 1 is carried out in response to the pilot signal SP contained in the signal SF.

Also, the signal SF derived from the amplifier 12 is supplied to the bandpass filter 13 so as to derive the FM luminance signal SY. This FM luminance signal SY is supplied to the A/D converter 14 in order to be A/D-converted into, for instance, an 8-bit digital signal for 1 sample, whose sampling frequency is eight times higher than the color subcarrier frequency fSC (approximately 3.58 MHz). Then, this 8-bit digital signal SY is supplied to the processing circuit 15 in which such process operations as FM demodulation and deemphasis are carried out. Then, the processed signal SY is supplied to the D/A converter 16 so as to be D/A-converted into the original baseband luminance signal Y which will then be derived from the terminal 17.

Furthermore, the signal SF derived from the amplifier 12 is supplied to the bandpass filter 21, thereby deriving the color carrier signal SC. This color carrier signal SC is supplied to the A/D converter 22 so as to be A/D-converted into, for instance, an 8-bit digital signal SC for 1 sample, having a sampling frequency four times higher than the color subcarrier frequency.

Then, this 8-bit digital signal SC is supplied to the processing circuit 23 so that such processing operations as APC and eliminations of track crosstalk components are carried out, and this digital signal SC is color-demodulated into the baseband red and blue color difference signals (R-Y) and (B-Y). These color difference signal (R-Y) and (B-Y) are supplied via the converting circuit (will be discussed later) 24 to the NTSC encoder 25 in which the color subcarrier frequency is encoded into the color carrier signal SS having the frequency fSC. This color carrier signal SS is supplied into the D/A-converter 26 so as to be D/A-converted into the original color carrier signal SS, which will then be derived from the terminal 27.

At this time, both of the luminance signal Y derived from the D/A converter 16 and the color carrier signal SS derived from the D/A converter 26 are supplied to the adding circuit 18, so that the NTSC composite signal is synthesized which will then be derived from the terminal 19.

Moreover, the signal SF from the amplifier 12 is furnished to the audio processing circuit 31, so that the original audio signals "L" and "R" are demodulated from the FM audio signal SA contained in this signal SF. These original audio signals are derived from the terminal 32.

In the above-described signal reproducing system, both of the reproduced FM luminance signal SY and color carrier signal SC contain variations in a time axis such as "jitter". Also, the time axis is changed when the VTR signal is reproduced at varied speeds. As a consequence, when the various signal processing operations are carried out in the processing circuits 15 and 23, the clock thereof is produced from the horizontal sync signal contained in the reproduced FM luminance signal SY. Then, as a result, various variations are produced in the sampling phases (namely, phase at time instant when data is obtained) among the luminance signals Y outputted from the processing circuits 15, 23, and the color difference signals (R-Y), (B-Y) outputted from the processing circuit 23.

Therefore, the circuit for stabilizing the sampling phases and for aligning the sampling phases of the color difference signals (R-Y) and (B-Y) derived from the processing circuit 23 is the converting circuit 24. That is to say, the converting circuit 24 is to convert the sampling phases of the color difference signals (digital data) derived from the processing circuit 23 into the clock phases of the encoder 25 even when the processing circuit 23 is operated in a synchronism with the encoder 25.

In the signal reproducing system of FIG. 7, the signal recording system similarly requires such a converting circuit for stabilizing and aligning the sampling phases in the digital processing circuit for the color carrier signal due to the same jitter reason.

The present invention has an object to provide a novel converting circuit for converting such a sampling phase of digital data. More specifically, the present invention has another object to provide a converting circuit with a simple structure, whose characteristic is better than that of the conventional converting circuit.

SUMMARY OF THE INVENTION

To achieve these object, a converting circuit according to the present invention is accomplished. That is, in a converting circuit for converting first digital data DIN synchronized with a first clock CK into second digital data D OUT synchronized with a second clock CK not synchronized with the first clock CK.

1 (one) time period of said first clock CK is divided into N time periods ("N" being larger than, or equal to 2), first and second interpolation coefficients KA, KB are set with respect to each of said divided time periods, and said second digital data D OUT is produced from data (n+1) within a certain clock period and data (n+2) within another clock period subsequent to said certain clock period among said first digital data DI, by using said first and second interpolation coefficients KA, KB in the divided period where said second clock XCK is located, among said first and second interpolation coefficients KA, KB set for each of said divided periods.

The first digital data is converted into the digital data having the sampling frequency equivalently N times higher than that of the first digital data. The data at the second clock position among then are derived as the converted output.

In accordance with the present invention, the sampling phase of the input data DIN can be converted. In this case, according to the converter circuit 50, the input data DIN is sampled at the clock having, for instance, the frequency four times higher than that of the clock frequency, so that the sampling phase may be equivalently converted. As a result, even when a phase difference is produced between the output clock XCK and the sampling point of the input data, this phase difference can be limited to a small range. Even when the clock XCK passes over the clock CK, or is delayed from this clock CK, distortion occurred in the output data D OUT can be reduced.

Further, since the input data can be filtered at the sampling frequency 4 times higher than the clock frequency, the bandwidth of the sampling frequency may have margin with respect to that of the input data DIN. Even when a filter having a less number of taps is employed deterioration in the frequency characteristics may be suppressed.

DETAILED DESCRIPTION OF THE PREFERRED EMBODIMENTS

Figure 1:
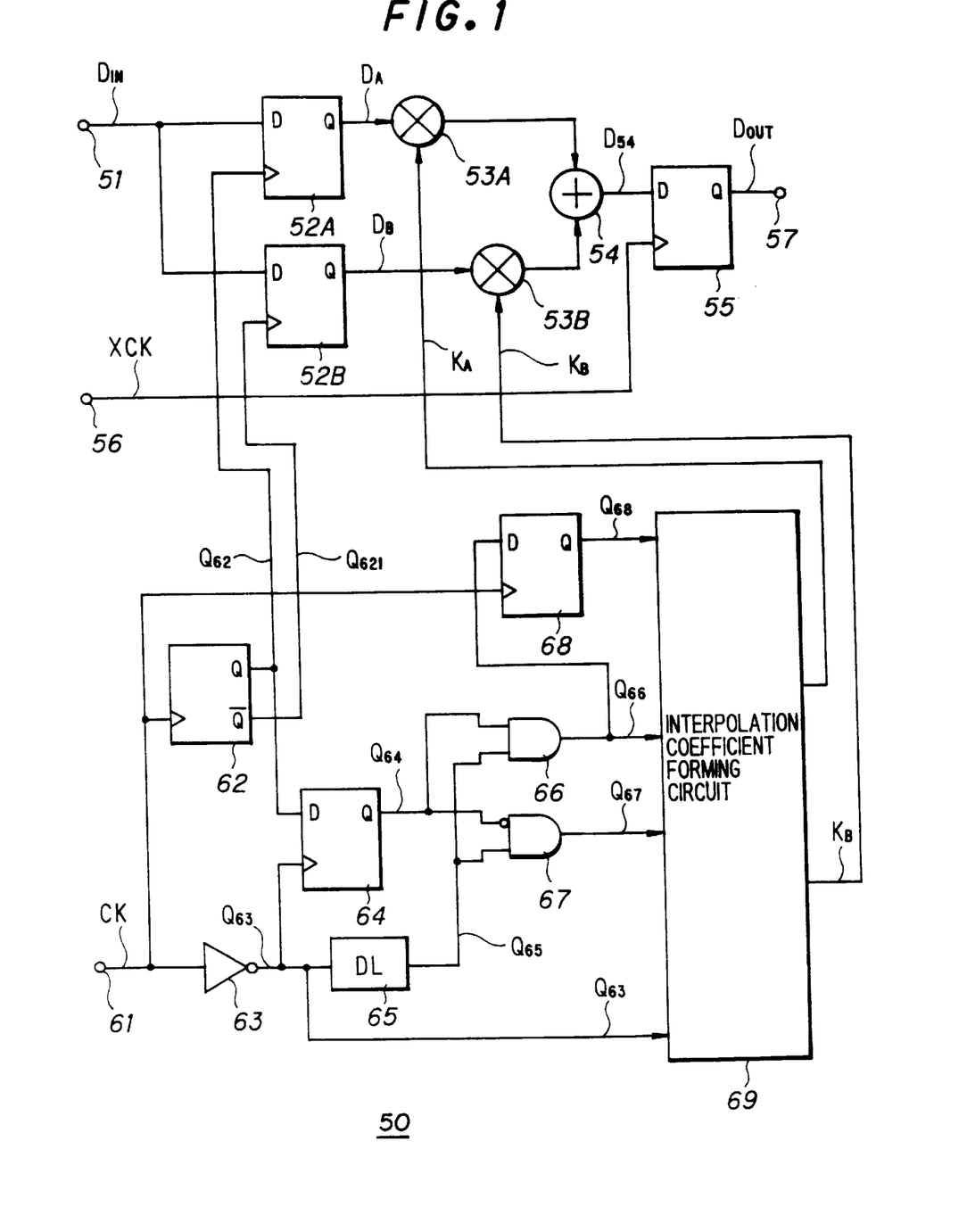
FIG. 1 is a schematic circuit diagram for showing an overall system of a sampling phase converting circuit according to an embodiment of the present invention.

In FIG. 1, reference numeral 50 indicates an example of a circuit for converting a sampling phase of digital data. This converting circuit 50 corresponds to, for instance, the converting circuit for converting either the color difference signal (R-Y), or the color difference signal (B-Y) in the converting circuit 24 of FIG. 6. Then digital data "DIN" to be converted is supplied via a terminal 51 to D-inputs of D flip-flop circuits 52A and 52B.

In this case, as to the data DIN, for instance, such parallel data is employed that 1 sample is equal to 8 bits. Accordingly, these flip-flop circuits 52A and 52B own 8-bit inputs/outputs, respectively. Also, for instance, as shown in FIG. 2A, it is assumed that 1 sample period (namely, 1 clock period) of the data DIN is a value of "τ", and also the sampling numbers of the data DIN are n, n+1, n+2, . . .

Further, a clock "CK" is supplied to a terminal 61. In the case of the signal reproducing system shown in FIG. 6, this clock CK corresponds to such a pulse formed by supplying the horizontal sync (synchronization) signal to the PLL (phase-locked loop). As shown in FIG. 2B, this clock CK is synchronized with the data DIN. Then, this clock CK is supplied via the terminal 61 to a T flip- flop circuit 62. As represented in FIG. 2C and 2D, the clock CK is inverted every 1 sampling period "τ", and also two pulses "Q62" and "Q62!" whose phases are opposite to each other are derived. These pulses Q62 and Q62! are supplied to the flip-flop circuits 52A and 52B as clocks thereof.

Figure 2:
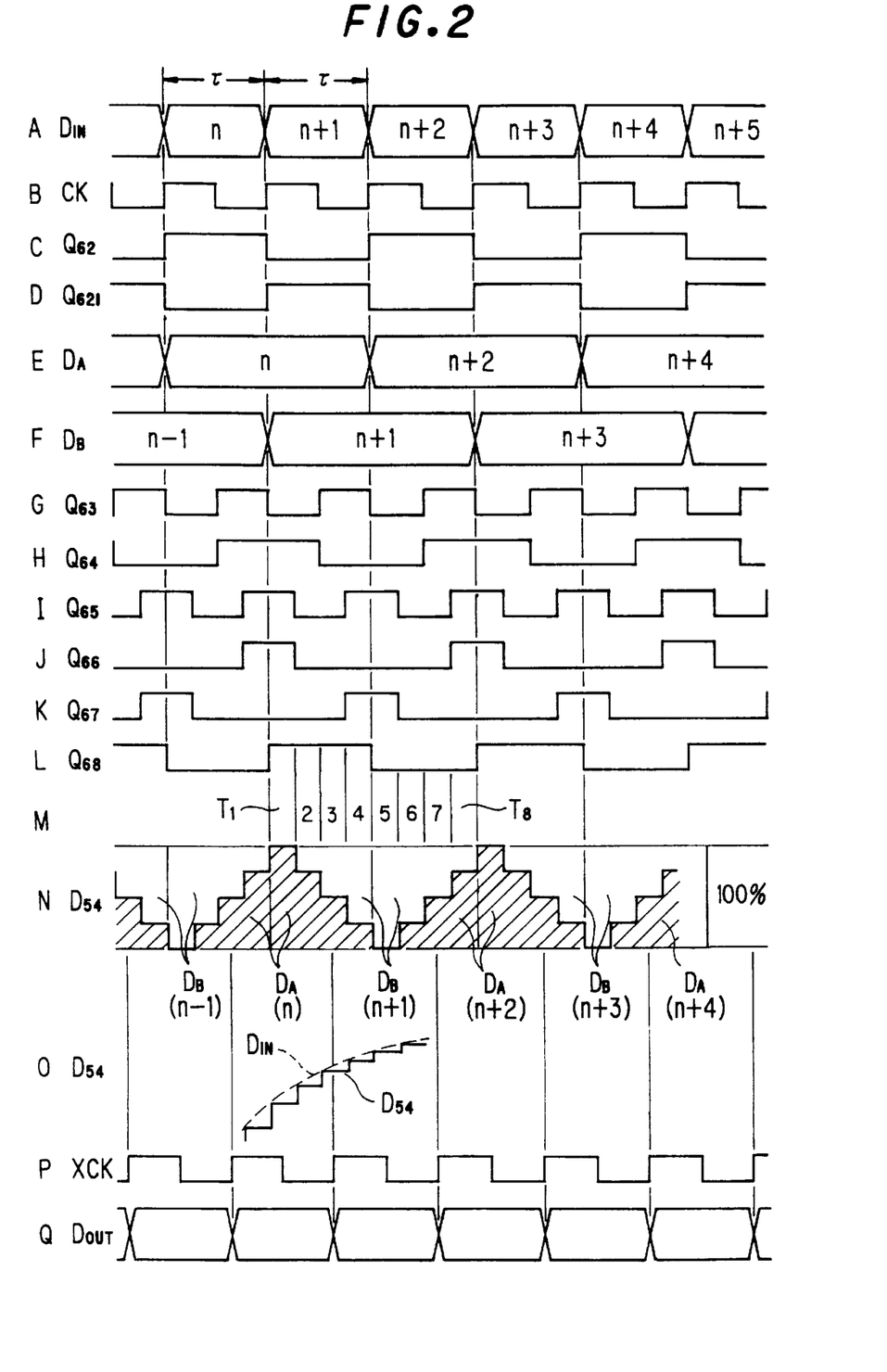
FIG. 2 represents a waveform chart for explaining operations of the converting circuit shown in FIG. 1.

As a consequence, as illustrated in FIG. 2E, for example, even-numbered sample data DA among the data DIN are derived from the flip-flop circuit 52A in a time period equal to the period "2τ". From the flip-flop circuit 52B, as shown in FIG. 2F, odd-numbered sample data DB among the data DIN are derived in a time period equal to the period "2τ", and are delayed from the first-mentioned data DA by a period "τ".

Furthermore, the pulse Q62 derived from the flip-flop circuit 62 is supplied to the D input of the D flip-flop circuit 64, and the clock CK from the terminal 61 is supplied to an invertor 63, so that a pulse Q63 whose phase is inverted is produced from this invertor 63, as shown in FIG. 2G. This pulse Q63 is supplied as a clock to the flip-flop circuit 64. Thus, as indicated in FIG. 2H, such a pulse Q64 is derived from the flip-flop circuit 64, which is inverted at each of the central time instants of the respective samples of the data DIN.

Also, the pulse Q63 derived from the inverter 63 is supplied to a delay circuit 65, so that as illustrated in FIG. 2I, a pulse Q65 is produced which is delayed by a time period of ¼τ from the pulse Q63. Then, this pulse Q65 is supplied to an AND (gate) circuit 66, and also the pulse Q64 from the flip-flop circuit 64 is supplied to this AND circuit 66. As represented in FIG. 2J, a pulse Q66 is derived from this AND circuit 66, which has a rising portion at the central ½τ period of the even-numbered data DA. Then, this pulse Q66 is supplied to an interpolation coefficient forming circuit 69.

Furthermore, the pulse Q65 from the delay circuit 65 is furnished to an AND circuit 67, and also the pulse Q64 from the flip-flop circuit 64 is supplied to a negative logic input of the AND circuit 67. From this AND circuit 67, as indicated in FIG. 2K, a pulse Q67 is derived which has a rising portion at the central ½τ period of the odd-numbered data DB. Then, this pulse Q67 is supplied to the interpolation forming circuit 69.

The pulse Q66 from the AND circuit 66 is supplied to a D-input of a D flip-flop circuit 68, and the clock CK from the terminal 61 is furnished to the flip-flop circuit 68 as a clock thereof. As shown in FIG. 2L, a pulse Q68 which is inverted at the changing points of the data DA and DB is derived from the flip-flop circuit 68. Then, this pulse Q68 is supplied to the interpolation coefficient forming circuit 69. Furthermore, the pulse Q63 derived from the inverter 63 is also supplied to this interpolation coefficient forming circuit 69.

Thus, the pulses Q68, Q66, Q67, and Q63 are supplied to the interpolation forming circuit 69. As apparent from FIG. 2, a time period obtained when these pulses Q68 to Q63 are combined with each other is equal to a time period "2τ". Then, as shown in FIG. 2M, for instance, the time period "2τ" of the sample numbers n+1 and n+2 of the data DIN is equally divided by ⅛ every time period of ¼τ. These divided time periods are successively defined as time periods T1 to T8.

Figure 3:
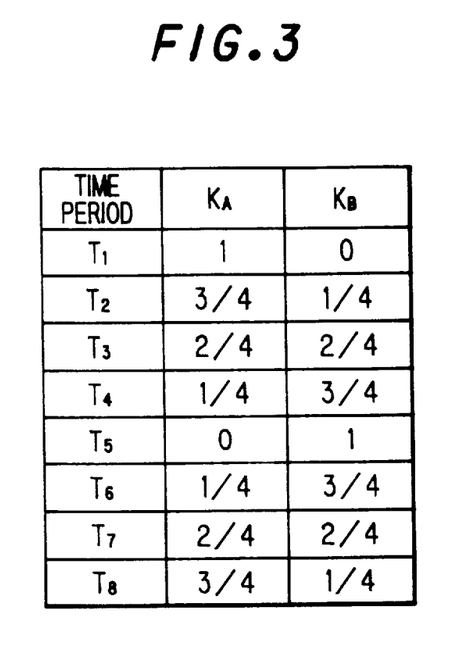
FIG. 3 indicates an example of interpolation coefficients.

Then, in this example, the input data DIN is linear-interpolated to obtain desirable output D OUT. To this end, as illustrated in FIG. 3, interpolation coefficients KA and KB are derived from the interpolation coefficient forming circuit 69, and these interpolation coefficients KA, KB own values which are complementary changed by ¼ every periods of ¼τ within the time periods T1 to T8.

Subsequently, the data DA and DB from the flip-flop circuits 52A and 52B are supplied to multiplier circuits 53A and 53B, and also the coefficients KA, KB from the interpolation coefficient forming circuit 69 are supplied to the multiplier circuits 53A and 53B, so that these coefficients KA and KB are multiplied with the data DA and DB. As shown in FIG. 2N, data D54 indicated by D54=KA×DA+ KB×DB is derived from the multiplier circuit 54.

As a consequence, the data D54 during the respective clock periods τ becomes such data that the ratio of the preceding sample to the data DIN is gradually decreased every ¼τ time period, and the ratio of the succeeding sample to the data DIN is gradually increased every ¼τ time period. Consequently, for example, as illustrated by a solid line in FIG. 2O (this implies D/A-converted waveform), the data D54 owns such a waveform that the data DIN is linear-interpolated, and is changed every ¼τ time period.

Then, this data D54 is supplied to a D-input of a D flip-flop circuit 55, and further, as shown in FIG. 2p, a clock XCK produced after the sampling phase has been converted is supplied as a clock from a terminal 56 to the flip-flop circuit 55. In the case of the reproducing system shown in FIG. 6, for example, this clock XCK corresponds to a signal having a stable frequency and a stable phase, which has been formed in a crystal oscillator circuit.

In this manner, as indicated in FIG. 2Q, the data Q54 is latched every clock XCK in the flip-flop circuit 55, so that latched data D OUT is derived from the terminal 57.

As a result, in this case, since the input data DIN is converted into the data D54 having the 4 times higher sampling frequency by way of the linear interpolation and the sample at the time instant of the clock XCK among this data D54 is derived as the data D OUT, this data D OUT must be equal to such data that the sampling phase of the input data DIN is converted into the phase of the clock XCK.

As described above, the sampling phase of the input data DIN may be converted by this converting circuit 50. In this case, in particular, according to this converting circuit 50, such an equivalent operation is achieved that the input data DIN is sampled at the clock 4 times higher than this input data to convert the sampling phase. As a result, even when a phase difference happens to occur between the output clock XCK and the sampling point of the input data DIN, this phase difference may be limited to a small range. Thus, even when the clock XCK passes over the clock CK, or is delayed from the clock CK, distortion occurred in the output data D OUT may be reduced.

Further, since the input data can be filtered at the sampling frequency 4 times higher than the clock frequency, the bandwidth of the sampling frequency may have margin with respect to that of the input data DIN. Even when a filter having a less number of taps is employed, deterioration in the frequency characteristics may be suppressed. In the example shown in FIG. 1, the data at the time instants of the clock XCK among the data D54 synthesized in the adder circuit 54 is latched in the D flip-flop circuit 55 to obtain the output data D OUT, whereas in the example indicated in FIG. 4, the respective data before being synthesized in the adder circuit are latched to obtain the output data D OUT.

Figure 4:
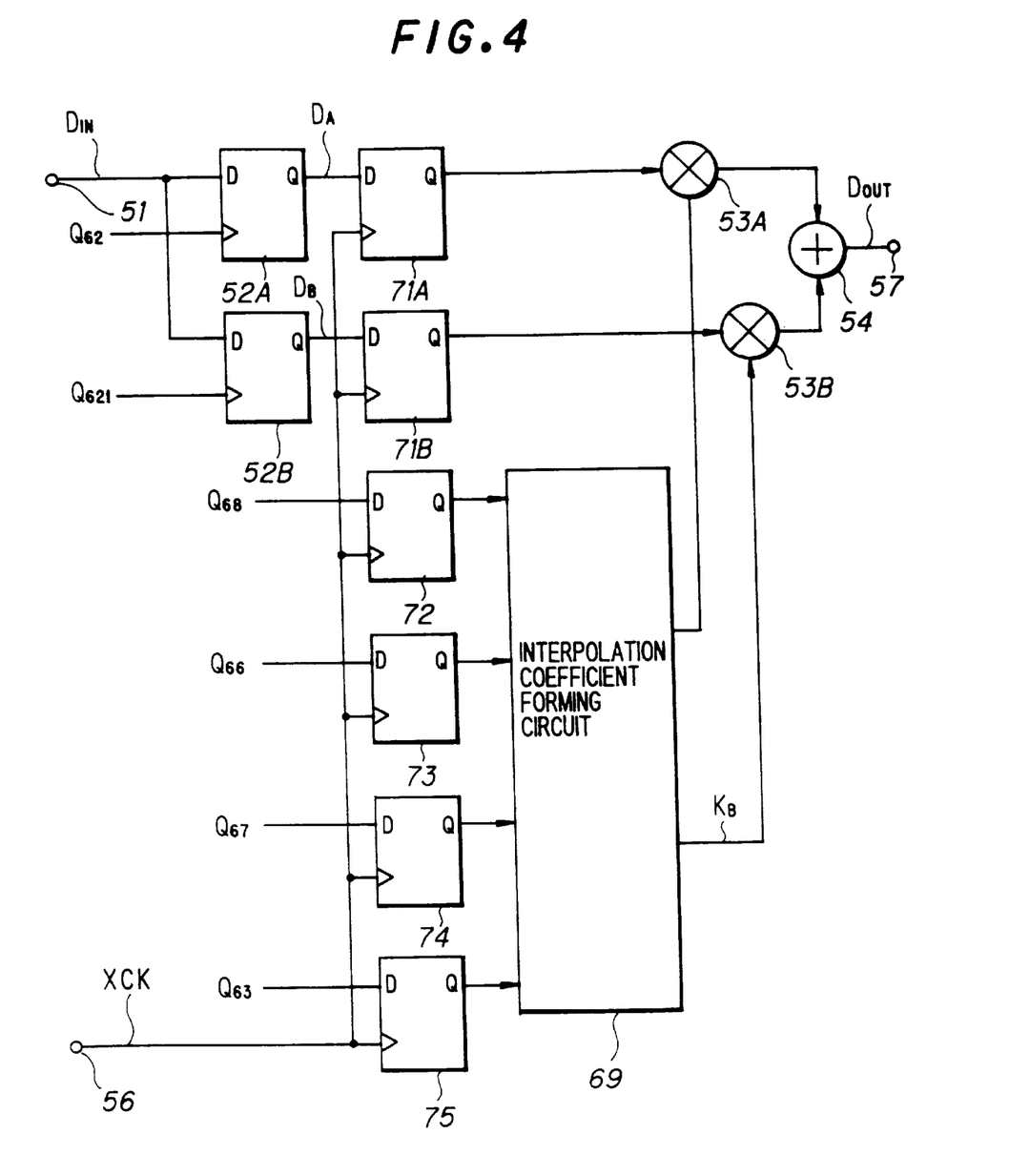
FIG. 4 is a schematic circuit diagram for showing a portion of another system of a sampling phase converting circuit according to another embodiment of the present invention.

That is, in the example indicated in FIG. 4, the data DA and DB derived from the D flip-flop circuits 52A and 52B are supplied to D flip-flop circuits 71A and 71B, and also the clock XCK is furnished to the D flip-flop circuits 71A and 71B as clock inputs thereof. The data at the rising time instants of the clock XCK among the data DA and DB are latched by the D flip-flop circuits 71A and 71B during this clock time period. These latched data DA and DB are supplied to multiplier circuits 53A and 53B.

The pulses Q68, Q66, Q67, Q63 are supplied through D flip-flop circuits 72 to 75 to the interpolation coefficient forming circuit 69, and further the clock XCK is supplied to the D flip-flop circuits 72 to 75. The coefficients KA and KB at the rising time of the clock XCK, namely the time period within the time periods T11 to T8, where the rising portion of the clock XCK is present, are supplied to the multiplier circuits 53A and 53B during this clock time period.

As a consequence, such data D OUT that the sampling phase has been converted at the time instant of the clock XCK is outputted from the adder circuit 54, and this data D OUT is derived from the terminal 57.

Figure 5:
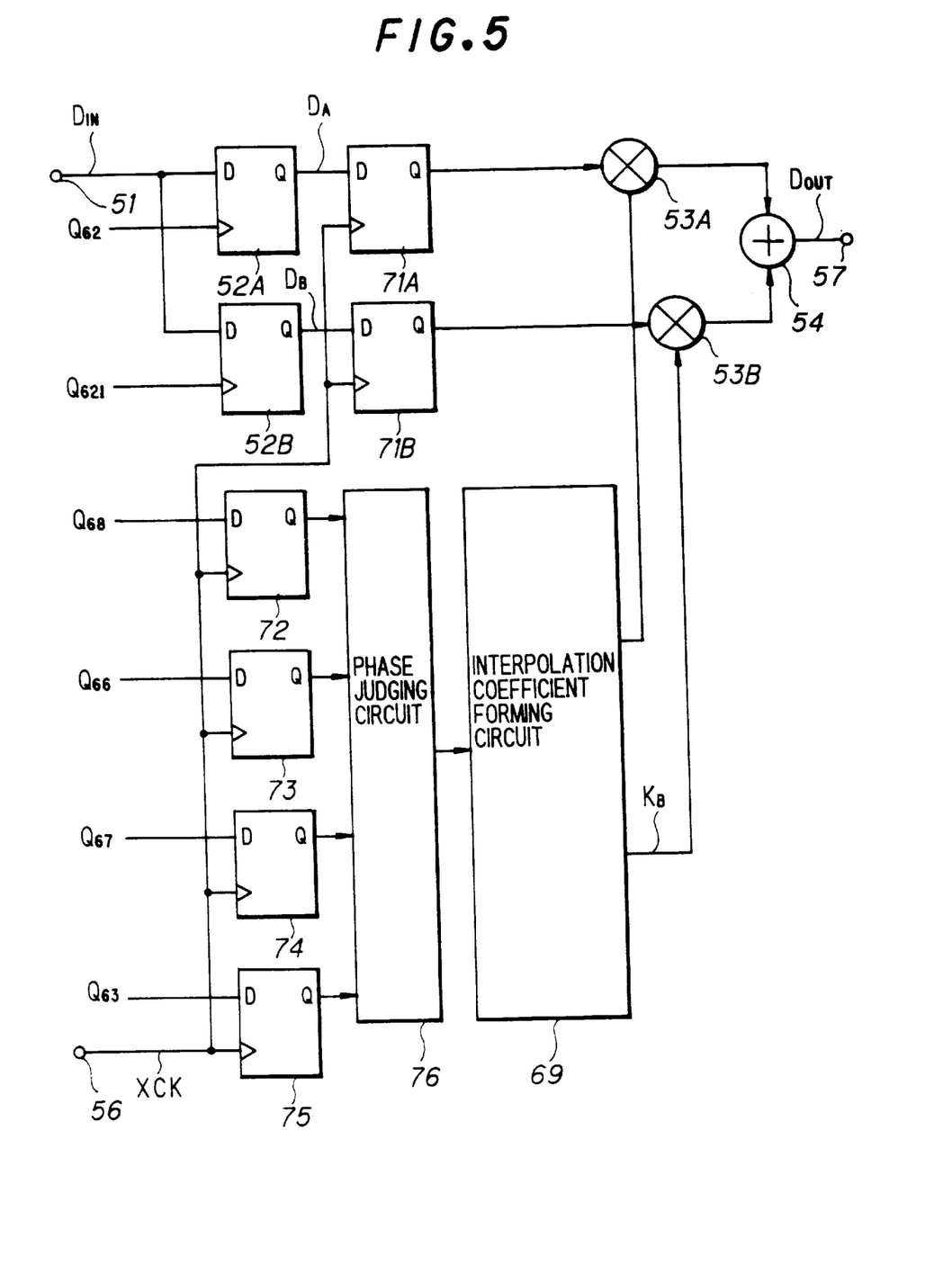
FIG. 5 is a schematic circuit diagram for indicating a portion of another system according to a further embodiment of the present invention.

Also, in the example shown in FIG. 5, the pulses Q68, Q66, Q67, Q63 at the rising time of the clock XCK are latched by the D flip-flop circuits 72 to 75 until the rising portion of the subsequent clock XCK. Then, this latched result is supplied to a phase judging circuit 76. The phase judging circuit 76 judges that these pulses Q68, Q66, Q67, Q63 belong to any one of these time periods T1 to T8, and holds the judgment result during the time period of the clock XCK.

Then, this judgment result is supplied to the interpolation coefficient forming circuit 69 to derive the coefficients KA and KB corresponding to the time period judged from the time periods T1 to T8. These derived coefficients KA and KB are supplied to the multiplier circuits 53A and 53B, respectively. As a consequence, such data D OUT that the sampling phase has been converted at the time instant of the clock XCK is outputted from the adder circuit 54, and the resultant data is derived to the terminal 57.

It should be noted that although the coefficients KA and KB for linear-interpolating the data DA and DB have been formed in the interpolation coefficient circuit 69 in the above description, these coefficients KA and KB may be substituted by interpolation coefficients by other functions. In such a case that the levels of the data DA and DB are not stable during the time periods T4, T5, T8 and T1, the data may be substituted by, for instance, one preceding sample. Moreover, the delay circuit 65 may be constructed of an analog circuit, or a digital circuit by using a counter.

What is claimed is:

1. A converting circuit for converting first digital data synchronized with a first clock into second digital data synchronized with a first clock wherein said first and second clocks are not synchronized with each other, comprising:

first latch means for latching said first clock for a period substantially longer than a unit period of said first clock, to thereby produce a first latched clock;

second latch means controlled by said first latched clock for latching said first digital data to thereby produce first latched digital data and controlled by the inverse of said first latched clock for latching said first digital data to thereby produce second latched digital data;

a dividing circuit for dividing each unit period of said first clock into N divided time periods, N≧2;

a coefficient setting circuit for setting first and second interpolation coefficients with respect to each of said divided time periods; and a data producing circuit for producing, for each of said divided time periods, said second digital data by factoring said first latched digital data by said first interpolation coefficient and factoring said second latched digital data by said second interpolation coefficient and latching the factored data at a time corresponding to said second clock.

2. A converting circuit as claimed in claim 1, wherein said data producing circuit yields said factored data having a clock frequency four times higher than that of said first digital data.

3. A converting circuit as claimed in claim 1, further comprising an adding circuit for adding said factored data of said first and second latched digital data, wherein said data producing circuit latches the first and second latched digital data added by said adding circuit at said time corresponding to said second clock.

4. A converting circuit as claimed in claim 1 wherein said dividing circuit divides said unit period of said first clock into 4 time periods, such that N=4.

5. A converting circuit as claimed in claim 1, wherein said first latch means latches said first clock for twice said unit period of said first clock.

6. A converting circuit as claimed in claim 5, wherein said first latch means is a T flip-flop circuit.

7. A converting circuit as claimed in claim 1, wherein said dividing circuit comprises:

third latch means, controlled by said inverse of said first clock, for latching said first latched clock;

a first logic circuit for producing the logical result of said first latched clock latched by said third latch means AND said inverse of said first clock delayed by a delay to thereby produce a first divided signal;

a second logic circuit for producing the logical result of an inverse of said first latched clock latched by said third latch means AND said inverse of said first clock delayed by said delay to thereby produce a second divided signal;

fourth latch means, controlled by said first clock, for latching said first divided signal to produce a third divided signal;

wherein, said inverse of said first clock is a fourth divided signal; and wherein said divided signals determine the number of said N divided time periods.

8. A converting circuit as claimed in claim 7, wherein said dividing circuit further comprises fifth latch means for latching the first, second, third and fourth divided signals at the control of said second clock.

9. A converting circuit as claimed in claim 8, further comprising a phase judging circuit for judging when said first, second, third and fourth divided signals correspond to said divided periods and latching said divided signals in response thereto.

10. A converting circuit as claimed in claim 1, wherein said data producing circuit comprises a latch circuit, controlled by said second clock, for producing said second digital data by latching said first latched digital data and said second latched digital data in each of said divided time periods.

11. A method for converting first digital data synchronized with a first clock into second digital data synchronized with a second clock wherein said first and second clocks are not synchronized with each other, comprising the steps of:

latching said first clock for a period substantially longer than a unit period of said first clock, to thereby produce a first latched clock;

latching said first digital data in response to said first latched clock to thereby produce first latched digital data and latching said first digital data in response to the inverse of said first latched clock to thereby produce second latched digital data;

dividing each unit period of said first clock into N divided time periods, N≧2;

setting first and second interpolation coefficients with respect to each of said divided time periods; and producing, for each of said divided time periods, said second digital data by factoring said first latched digital data by said first interpolation coefficient and factoring said second latched digital data by said second interpolation coefficient and latching the factored data at a time corresponding to said second clock.

12. A converting method as claimed in claim 11 wherein said factoring yields said factored data having a clock frequency four times higher than that of said first digital data.

13. A converting method as claimed in claim 11 further comprising the step of adding said factored data of said first and second latched digital data, wherein the step of producing latches the added factor data at said time corresponding to said second clock.

14. A converting method as claimed in claim 11 wherein said step of dividing divides said unit period of said first clock into 4 time periods, such that N=4.

15. A converting method as claimed in claim 11, wherein said first clock is latched for twice said unit period of said first clock.

16. A converting method as claimed in claim 15, wherein said step of latching said first clock employs a T flip-flop circuit.

17. A converting method as claimed in claim 11, wherein said step of dividing further comprises the steps of:

latching said first latched clock in response to said inverse of said first clock;

delaying said inverse of said first clock to thereby produce a delayed inverse of said first clock;

producing the logical result of said first latched clock AND said delayed inverse of said first clock to thereby produce a first divided signal;

producing the logical result of an inverse of said second latched clock AND said delayed inverse of said first clock to thereby produce a second divided signal;

latching said first divided signal in response to said first clock to thereby produce a third divided signal;

wherein, said inverse of said first clock is a fourth divided signal; and wherein said divided signals determine the number of said N divided time periods.

18. A converting method as claimed in claim 17, wherein said step of dividing further comprises the step of latching the first, second, third and fourth divided signals in response to said second clock.

19. A converting method as claimed in claim 18, further comprising the steps of:

judging when said first, second, third and fourth divided signals correspond to said divided periods; and latching said divided signals when judged to correspond to said divided periods.

20. A converting method as claimed in claim 11, wherein said step of producing latches, in response to the second clock, said first latched digital data and said second latched digital data in each of said divided time periods.

* * * * *